US009463536B2

(12) United States Patent
Rice et al.

(10) Patent No.: US 9,463,536 B2
(45) Date of Patent: Oct. 11, 2016

(54) MANUFACTURING PROCESS FOR THERMOSIPHON HEAT EXCHANGER

(71) Applicant: Google Inc., Mountain View, CA (US)

(72) Inventors: Jeremy Rice, Austin, TX (US); Huan D. Nguyen, Mountain View, CA (US); Jeffrey S. Spaulding, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 265 days.

(21) Appl. No.: 14/137,258

(22) Filed: Dec. 20, 2013

(65) Prior Publication Data

US 2015/0174709 A1    Jun. 25, 2015

(51) Int. Cl.
*B23P 15/26* (2006.01)
*F28D 15/02* (2006.01)
*H01L 23/427* (2006.01)
*H01L 23/467* (2006.01)
*H01L 23/40* (2006.01)

(52) U.S. Cl.
CPC ........... *B23P 15/26* (2013.01); *F28D 15/0233* (2013.01); *F28D 15/0266* (2013.01); *F28D 15/0275* (2013.01); *H01L 23/427* (2013.01); *H01L 23/467* (2013.01); *F28F 2275/04* (2013.01); *H01L 23/40* (2013.01); *H01L 23/4006* (2013.01); *H01L 2924/0002* (2013.01); *Y10T 29/49364* (2015.01)

(58) Field of Classification Search
CPC .. B23P 15/26; H01L 23/427; F28D 15/0266; B21D 53/02; Y10T 29/49364
See application file for complete search history.

(56) References Cited

U.S. PATENT DOCUMENTS

| 5,743,014 | A | * | 4/1998 | Giammaruti | ........ F28D 15/0283 |
|---|---|---|---|---|---|
| | | | | | 29/890.032 |
| 5,867,904 | A | * | 2/1999 | Harris | ..................... B23P 15/26 |
| | | | | | 29/890.046 |
| 5,966,957 | A | | 10/1999 | Malhammar et al. | |
| 6,073,683 | A | | 6/2000 | Osakabe et al. | |
| 6,840,311 | B2 | | 1/2005 | Ghosh et al. | |
| 6,917,522 | B1 | | 7/2005 | Erturk et al. | |
| 7,055,341 | B2 | | 6/2006 | Nori et al. | |
| 7,154,749 | B2 | | 12/2006 | Stefanoski et al. | |
| 2002/0023456 | A1 | | 2/2002 | Sone | |
| 2010/0073863 | A1 | | 3/2010 | Matsushima et al. | |

(Continued)

FOREIGN PATENT DOCUMENTS

WO    2010/027311    3/2010

OTHER PUBLICATIONS

Bielinski, Henryk et al., Computer Cooling Using a Two Phase Minichannel Thermosyphon Loop Heated from Horizontal and Vertical Sides and Cooled from Vertical Side, Archives of Thermodynamics, vol. 31 (2010), No. 4, pp. 51-59, Oct. 2010.

(Continued)

*Primary Examiner* — Moshe Wilensky
(74) *Attorney, Agent, or Firm* — Fish & Richardson P.C.

(57) ABSTRACT

A method of assembling a thermosiphon system includes placing a base of an evaporator and a tube of a condensate line in a brazing fixture such that the base covers an aperture in a bottom of the tube with a bottom surface of the base abutting a precision machined surface of the brazing fixture, and simultaneously brazing the base and the tube while held by the brazing fixture to form a unitary body in a single brazing process, the unitary body including the evaporator and the condensate line.

7 Claims, 14 Drawing Sheets

(56) References Cited

U.S. PATENT DOCUMENTS

2012/0268877 A1    10/2012   Rice et al.
2013/0256386 A1*   10/2013   Schacht ............... B23K 1/0018
                                                                                     228/44.3

OTHER PUBLICATIONS

International Search Report and Written Opinion for International Patent Application No. PCT/US2013/049768, filed Jul. 9, 2013. Dated Oct. 23, 2013. 13 pages.

* cited by examiner

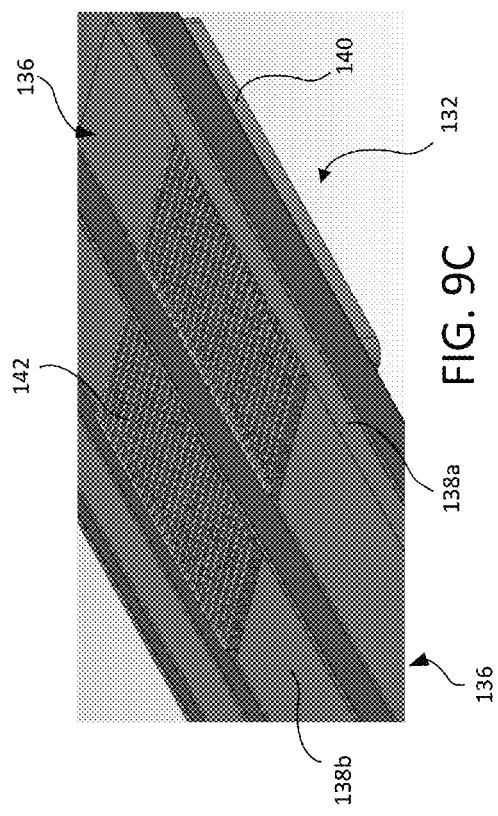
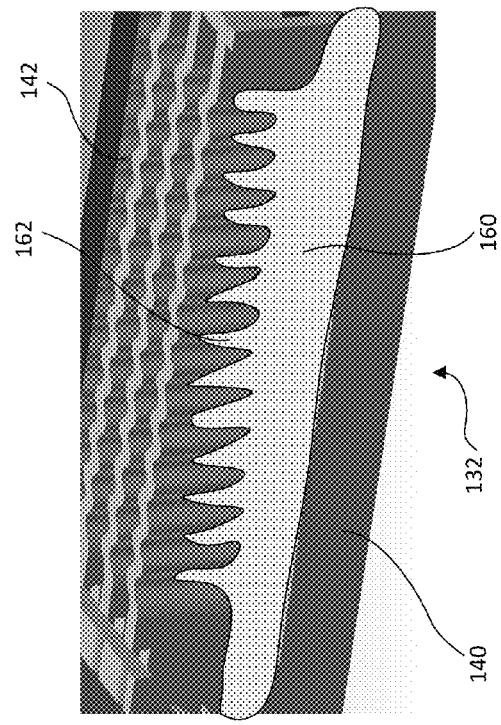
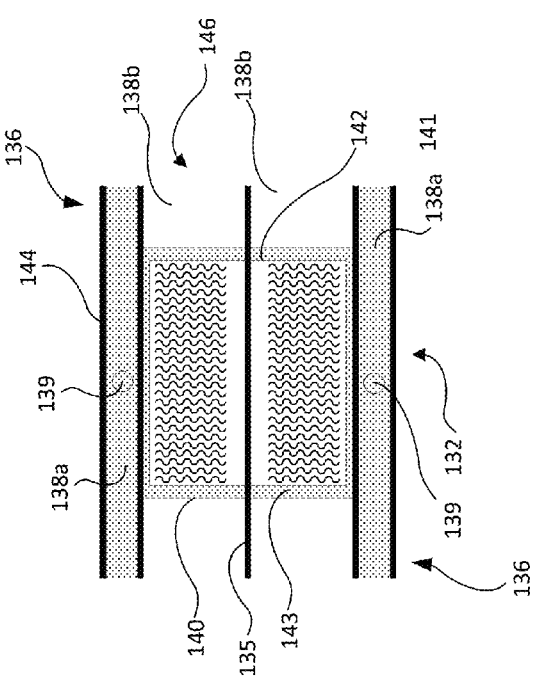

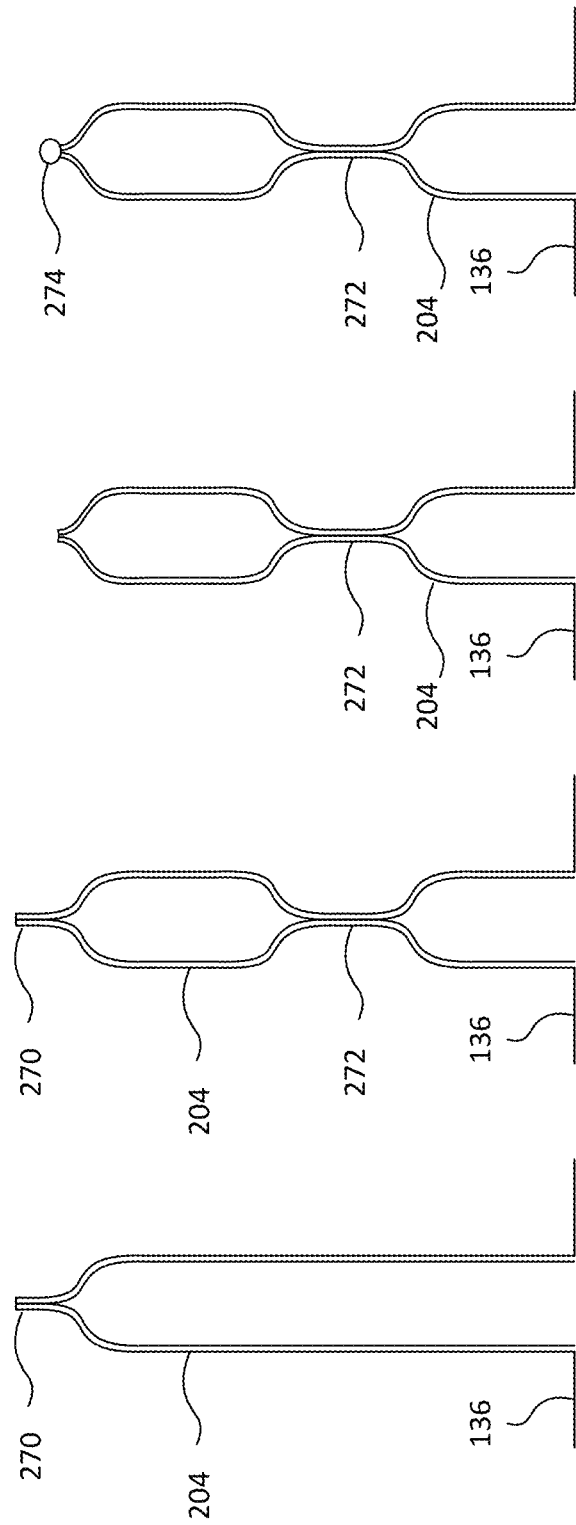

MANUFACTURING PROCESS FOR THERMOSIPHON HEAT EXCHANGER

TECHNICAL FIELD

This invention relates to methods of manufacturing thermosiphon systems.

BACKGROUND

Computer users often focus on the speed of computer microprocessors (e.g., megahertz and gigahertz). Many forget that this speed often comes with a cost-higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, and other heat generating devices) that are located on a server rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

As noted above, electronic devices, e.g., computer components, such as processors and memories, generate heat. A thermosiphon system can be used to remove heat from such an electronic device. For commercial applicability, the thermosiphon needs to operate with high efficiency and have a long lifetime.

Without being limited to any particular theory, leakage of the working fluid over time can lead to reduction in efficiency over time. In addition, again without being limited to any particular theory, deviation from planarity by the bottom surface of the evaporator can reduce thermal contact with the component, leading to a reduction in efficiency.

Several techniques are described, which can be used individually or in combination. Manufacturing techniques can provide improved sealing of the working fluid inside the thermosiphon system. Manufacturing techniques can provide improved planarity of the bottom surface of the evaporator.

In one aspect, a method of assembling a thermosiphon system includes placing a base of an evaporator and a tube of a condensate line in a brazing fixture such that the base covers an aperture in a bottom of the tube with a bottom surface of the base abutting a precision machined surface of the brazing fixture, and simultaneously brazing the base and the tube while held by the brazing fixture to form a unitary body in a single brazing process, the unitary body including the evaporator and the condensate line.

Implementations can include one or more of the following features.

A brazing material may be applied to a portion of the base that will contact the tube.

The base and the tube may be placed between an upper portion of the brazing fixture and a lower portion of the brazing fixture, and a force may be applied to urge the upper portion and the lower portion toward each other.

Applying the force may include clamping the base and the tube between the upper portion and the lower portion.

The lower portion may have the precision machined surface.

The upper portion may be a planar plate having a plurality of apertures therethrough.

The lower portion may include a planar plate and at least one reinforcement wall.

The lower portion may include a plurality of reinforcement walls extending at a right angle from the planar plate at opposing edges of the planar plate.

The base and the tube may consist of aluminum.

The single brazing process may include heating the base and the tube to a temperature of between about 580 and 620° C.

In another aspect, a method of assembling a thermosiphon system includes charging the thermosiphon system with a working fluid through a fill tube, crimping the fill tube to form a crimp, pinching the fill tube at a position to provide a pinch further from an end of the fill tube than the crimp, removing a portion of the fill tube including the crimp but not the pinch, and sealing the fill tube.

Implementations can include one or more of the following features.

Sealing the fill tube may include filling a portion of the fill tube beyond the pinch with a filler material.

The filler material may include a brazing material, and the portion of the fill tube beyond the pinch may be brazed.

Heat may be applied selectively to the portion of the fill tube beyond the pinch to braze the brazing material.

Applying heat selectively may include heating the fill tube with a torch.

The fill tube may be polished prior to charging the thermosiphon system.

Polishing may include polishing an interior surface of the tube.

Polishing may include polishing an exterior surface of the tube.

One or more of the following advantages may be realized. The working fluid can be sealed more effectively in the thermosiphon system, thus reducing leakage, resulting in improved thermosiphon lifetime and efficiency. Planarity of the bottom surface of the evaporator can be improved, thus improving thermal contact between the evaporator and the computer component, resulting in improved efficiency.

The details of one or more implementations are set forth in the accompanying drawings and the description below. Other aspects, features, and advantages of the invention will be apparent from the description and drawings, and from the claims.

DESCRIPTION OF DRAWINGS

FIG. 9C illustrates an isometric cut-away view of the implementation of the evaporator of FIGS. 9A and 9B.

FIG. 9D illustrates a top view of the implementation of the evaporator of FIGS. 9A and 9B.

FIG. 9E illustrates a detailed view of an implementation of an evaporator fins in the implementation of the evaporator of FIGS. 6A and 6B.

FIGS. 20A-2D illustrate a fill tube during steps in a process for sealing the fill tube.

Like reference symbols in the various drawings indicate like elements.

DETAILED DESCRIPTION

This document discusses a thermosiphon system that can be implemented to remove heat from an electronic device, e.g., a component of computing equipment, such as a processor or memory. The evaporator of the thermosiphon system contacts the electronic device so that the electronic device experiences a conductive heat transfer effect. Thus, the thermosiphon system can act as a heat sink for the electronic device, reducing the likelihood of overheating and subsequent failure of the electronic device.

In particular, the thermosiphon system can be mounted on or integrated with a server rack sub-assembly for insertion into a server rack. The server rack sub-assembly can contain or support a number of heat-generating electronic devices, and the evaporator of the thermosiphon system can contact one or more of the electronic devices. In addition, the thermosiphon system can be mounted on a circuit card assembly, a daughter card, and/or other boards that carry heat-generating electronic devices.

Figure 1:
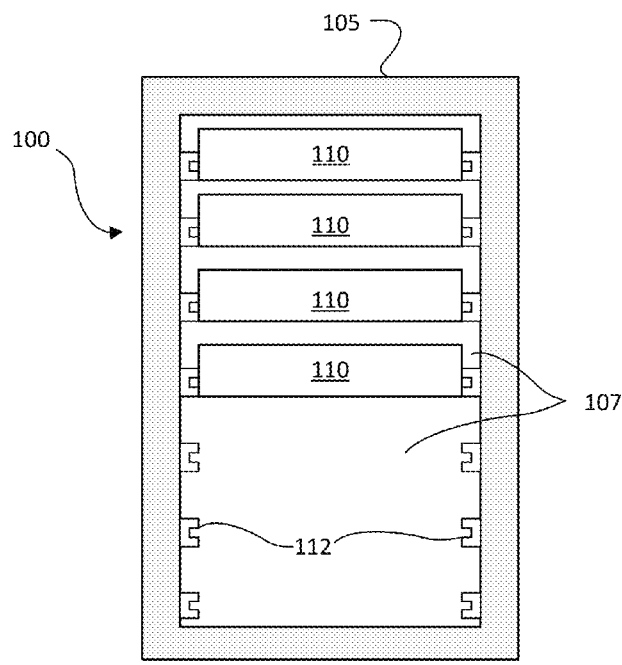
FIG. 1 illustrates a side view of a server rack and a server-rack sub-assembly configured to mount within the rack.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107. The slots, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2:
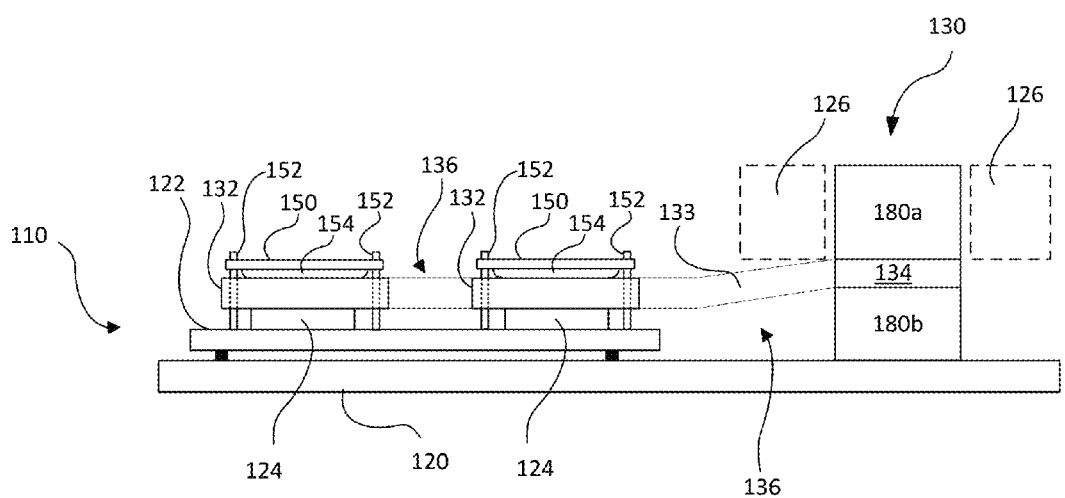
FIGS. 2 and 3 illustrate a side view and a top view of a server rack sub-assembly.
Figure 3:
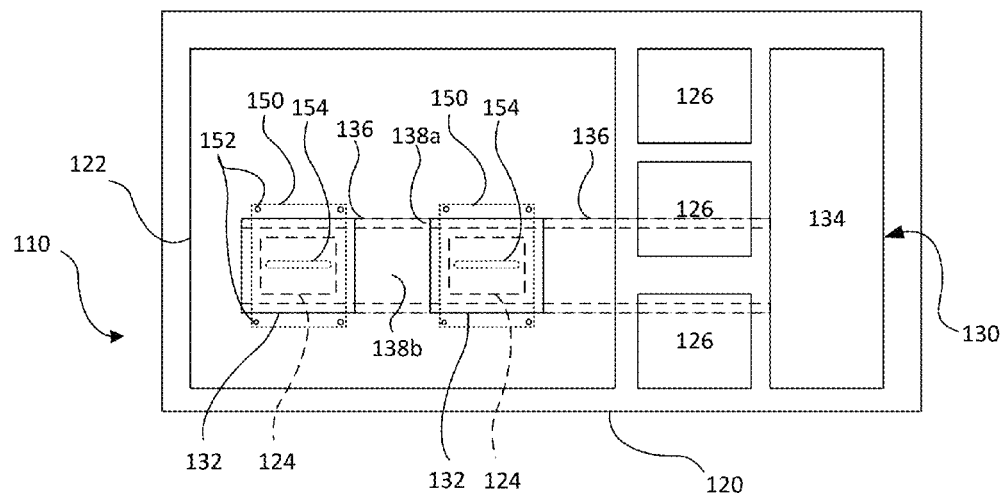
Figure 4:
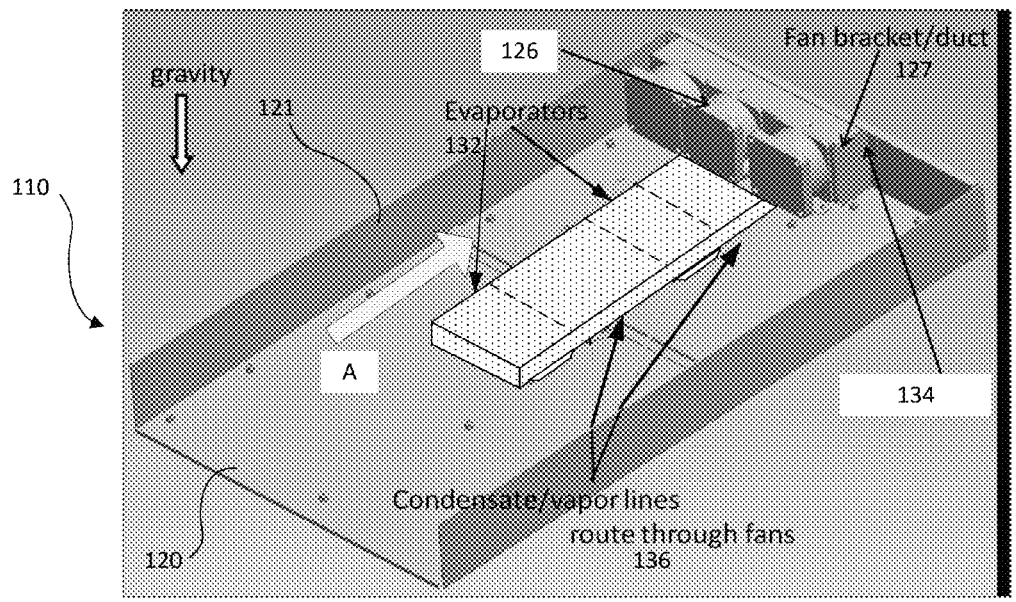
FIG. 4 illustrates a perspective view of a server rack sub-assembly (but omits the printed circuit board and heat generating elements to provide a view of more of the frame).

Referring to FIGS. 2, 3 and 4, the server rack sub-assembly 110 includes a frame or cage 120, a printed circuit board 122, e.g., a motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2 and 3 illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2 illustrates the frame 120 as a flat plate, the frame 120 can include one or more side walls 121 (see FIG. 4) that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIG. 3) of the server rack sub-assembly 110, closer to the front of the rack 105 when the sub-assembly 110 is installed in the rack 105, flows (see arrow A in FIG. 4) over the motherboard and over some of the heat generating components on the motherboard 122, and is exhausted from the server rack assembly 110 at the back edge (at the right hand side in FIG. 3), closer to the back of the rack 105 when the sub-assembly 110 is installed in the rack 105. The one or more fans 126 can be secured to the frame 120 by brackets 127. Thus, the fans 126 can pull air from within the frame 120 area and push the air after it has been warmed out the rack 105. An underside of the motherboard 122 can be separated from the frame 120 by a gap.

As shown in FIGS. 2-5, the thermosiphon system 130 includes an evaporator 132, a condenser 134, and a condensate/vapor line 136 connecting the evaporator region 132 to the condenser 134. The condensate/vapor line 136 includes at least two parallel passages, e.g., three parallel passages.

Figure 6:
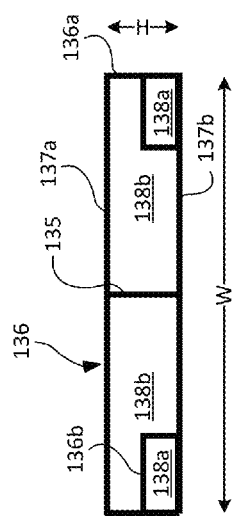
FIG. 6 illustrates a cross-sectional view of a condensate/vapor line, which can be a view taken along line 6-6 of FIG. 5.
Figure 8:
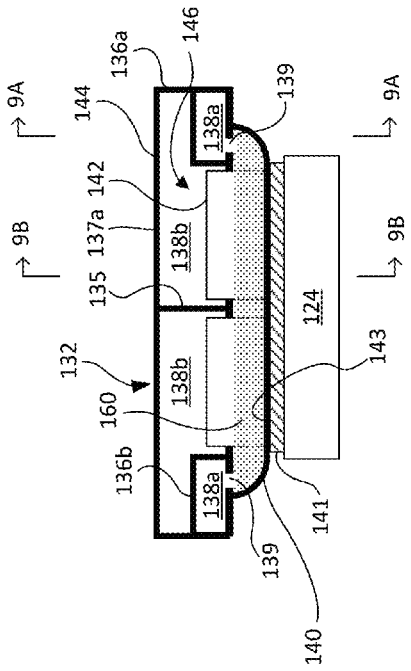
FIG. 8 illustrates a cross-sectional frontal view of an implementation of the evaporator.

In the implementation shown in FIG. 6, the condensate/vapor line 136 includes a central passage 138a and two outer passages 138b. The two outer passages 138b are positioned on opposite lateral sides of the central passage 138a and extend parallel to the central passage 138a. In particular, the outer passages 138b can be positioned adjacent to the side walls 136a of the tube that provides the condensate/vapor line 136. In addition, the outer passages 138b can be positioned adjacent the bottom floor of the tube that provides the condensate/vapor line 136. In operation, the central passage 138a carries a vapor phase of the working fluid from the evaporator 132 to the condenser 130, and the pair of outer passages 138b carry a liquid phase of the working fluid from the condenser 130 to the evaporator 132.

The condensate/vapor line 136 can be constructed as a flattened rectangular body, having a width W (measured perpendicular to the long axis of the evaporator) greater than its height H (measured perpendicular to the surface of the printed circuit board). As shown in FIG. 6, the evaporator 132 and the condensate/vapor line 136 can include a plurality of partitions, including two outer partitions 136b. The volume between each outer partition 136b and the side wall 136a and bottom wall 137b defines an outer passage 138b. The volume between the outer partitions 136b, between the top wall 137a and the bottom wall 137b, can define the central passage 138a.

In some implementations, the plurality of partitions also includes a central partition 135. The central partition 135 can extend from the top wall 137a to the bottom wall 137b of the condensate/vapor line 136. As shown in FIG. 6, the central partition 135 divides the central passage 138a into two or more passages. The central partition 135 can be a support strut that extends from the top wall 137a to the bottom wall 137b to provide improved structural strength and stability.

The pair of outer passages 138a, taken together, can be about 5-25% of the cross sectional area of the central passage 138b, e.g., each outer passage 138a be about one-third the width of the central passage 138b. The outer partitions 136a can be located on opposite lateral sides of the central partition 136b, and run parallel to the central partition 136b.

Returning to FIGS. 2, 5 and 6, the evaporator 132 contacts the electronic device 124 so that heat is drawn by conductive heat transfer from the electronic device 124 to the evaporator 132. In particular, the bottom of the evaporator 132 contacts the top of the electronic device 124. In operation, heat from the electronic device 124 causes a working fluid in the evaporator 132 to evaporate. The vapor then passes through condensate/vapor line 136, particularly through the central passage 138b, to the condenser 134. Heat is radiated away from the condenser 134, e.g., into air blown or drawn by the one or more fans 126 that pass across the condenser 134, causing the working fluid to condense. The condensed working fluid can flow back through the condensate/vapor line 136, particularly through the outer passages 138a, to the evaporator 132.

The evaporator 132 can be put in thermal contact with the electronic device 124 by a mounting bracket 150 that urges the evaporator 132 towards the electronic device 124. The mounting bracket 150 can be attached to the printed circuit board 122 by fasteners 152.

Figure 5:
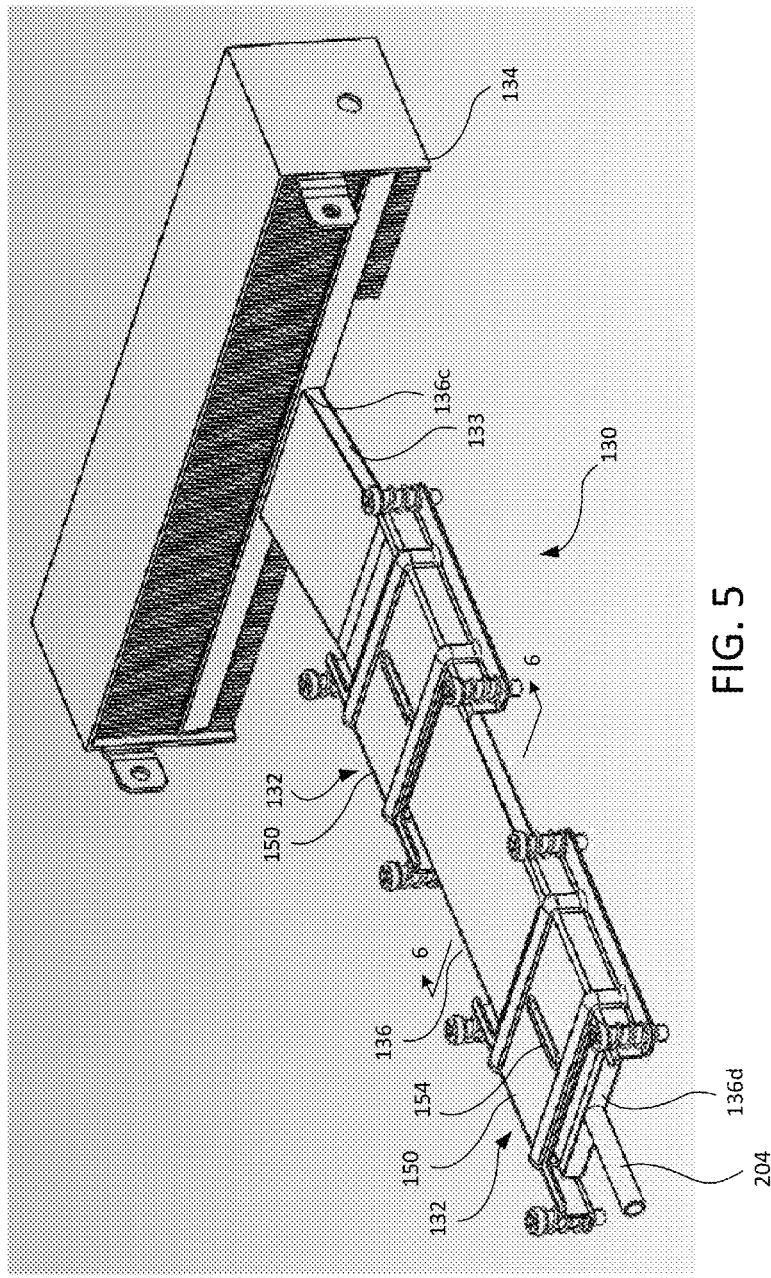
FIG. 5 illustrates a perspective view of a thermosiphon system.
Figure 7:
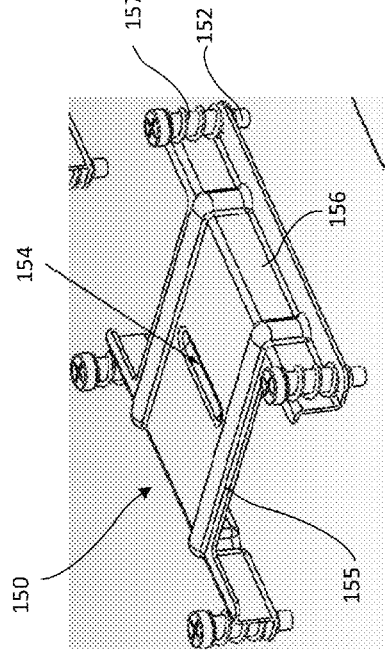
FIG. 7 is a perspective view of a mounting bracket.

Referring to FIGS. 2, 5, and 7, the mounting bracket, as mounted on the circuit board 122, can have a downwardly extending projection 154, e.g., a convex bump that applies a greater amount of pressure to the center of the evaporator 132. In some implementations, the projection 154 can be elongated, e.g., along the longitudinal axis of the condensate/vapor line 136. The projection 154 can span a length (measured parallel to the passages of the condensate/vapor line 136) of the evaporator 132. Additionally, the projection 154 can be centered across a width (measured perpendicular to the passages of the condensate/vapor line 136) of the evaporator 132. This configuration applies a greater amount of pressure along the center line of the evaporator, and can prevent the bottom of the evaporator 132 from bending away from the top of the electronic device 124. Maintaining good contact between the bottom of the evaporator 132 and the top of the electronic device 124 can improve cooling efficiency.

As shown in the implementation of FIGS. 5 and 7, the mounting bracket 150 includes a horizontally extending crosspiece 155. The downwardly extending projection 154 is formed on the bottom surface of the crosspiece 155. The crosspiece 155 extends horizontally between two side flanges 156 extend downwardly from the cross-piece 155. When installed on the circuit board 122, the side flanges 156 can sit on either side of the electronic device 124. Springs 157, which can bear against side flanges 156, urge the mounting bracket 150 downwardly.

As shown in FIG. 2, the condenser 134 can be located on a same side of one or more of the one or more fans 126 as the evaporator 132, e.g., the fans 126 are located on the opposite side of the condenser 134 from the evaporator 132. Alternatively or in addition, e.g., as shown in FIGS. 2 and 3, the condenser 134 can be located on an opposite side of one or more of the one or more fans 126 from the evaporator 132. The condensate/vapor line 136 can extend below the fans 126.

As shown in FIG. 2, a portion 133 of the condensate/vapor line 136 can be at a slight (non-zero) angle so that gravity causes the condensed working fluid to flow back through the condensate/vapor line 136 to the evaporator 132. The angle can be 1°-30°, e.g., 7.5°, relative to the relative to horizontal. Since the frame 120 is typically held horizontally in operation, the angle can be 1°-30° relative to the surface of the frame. Thus, in some implementations, at least a portion 133 of the condensate/vapor line 136 is not parallel to the main surface of the frame 120. For example, the condenser-side end 136c of the condensate/vapor line 136 can be about 1-5 mm, e.g., 2 mm, above the evaporator-side end 136d of the condensate/vapor line 136. However, it is also possible for the condensate/vapor line 136 to be horizontal, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIGS. 2 and 3, there is a first evaporator 132 and a second evaporator 132 as well as a first electronic device 124 and a second electronic device 124. The condensate/vapor line 136 connecting the first evaporator to the second evaporator can be level, or can have a slight positive angle (with the evaporator 132 and end of the tube 136 that is farther from the condenser 130 being lower than the other evaporator).

During operation, the top surface of the liquid inside the condenser will be above the top surface liquid height in the evaporator, e.g., by 1 to 10 mm. It can be easier to achieve this with a condensate/vapor line 136 that is at a slight (positive non-zero) angle, but proper selection of the thermal and mechanical properties of the working fluid in view of the expected heat transport requirements for the thermosiphon system may still achieve this for a condensate/vapor line 136 that is horizontal or at a slightly negative angle.

During operation, the liquid phase of a working fluid can fill at least a bottom portion of an interior volume of the outer passages 138a of the condensate/vapor line 136, with the bottom portion extending from the condenser to the evaporator region, and a vapor phase of the working fluid can pass through the central passage 138b of the condensate/vapor line 136. Furthermore, the liquid phase of the working fluid can flow from the outer passages 138a into the central passage 138b through one or more apertures 139. The liquid phase of the working fluid can fill at least a bottom portion of an interior volume of the condenser 124. Some portion of the outer passages 138a can carry vapor. Due to the separation of the central passage 138b from the outer passages 138a by the walls of the outer partitions 136a, shear stress between the liquid and the vapor phases of the working fluid flowing in opposite directions can be reduced, thus improving condensate flow to the evaporator and improving efficiency.

In some implementations, the condenser 134 can be located at a height above the evaporator 132 such that a liquid phase of the working fluid fills a portion of an interior volume of the condensate/vapor line 136, i.e., the outer passages 138a, and such that during operation a top surface of the liquid phase has at a non-zero angle relative to horizontal from the condenser 132 to the evaporator 134, and a vapor phase of the working fluid can pass through a portion of the interior volume of the condensate/vapor line 136, i.e., the central passage 138b, the portion extending from the condenser 132 to the evaporator 134.

FIGS. 2-4 illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. As shown in FIGS. 2-4, the multiple evaporators 132 can be connected by the condensate/vapor lines 136 to the condenser 134 in series, i.e., a first condensate/vapor line connects the condenser to a first evaporator, and a second condensate/vapor line connects the first evaporator to a second evaporator. Alternatively, some or all of the multiple evaporators 132 can be connected by the condensate/vapor lines 136 to the condenser 134 in parallel, i.e., a first condensate/vapor line connects the condenser to a first evaporator, and a second condensate/vapor line connects the condenser 134 to a second evaporator. An advantage of a serial implementation is fewer tubes, whereas an advantage of parallel tubes is that the tube widths can be smaller.

FIGS. 2-4 and 6 illustrate a thermosiphon system 130 in which a flattened rectangular body having a central passage and a pair of outer passages positioned on opposite lateral sides of the central passage is used for the condensate flow from the condenser 134 to the evaporator 132 and for vapor flow from the evaporator 132 to the condenser 134. Thus, in this implementation the fluidical coupling between the evaporator 132 and the condenser 134 consists of the combined condensate and vapor transfer line. A potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 136 can be a tube or pipe, e.g., of copper or aluminum.

Furthermore, the condensate/vapor line 136 can be manufactured by a metal extrusion process. The complete assembly of condensate/vapor line 136 and condenser 124 can have a limited number of parts, e.g., the vapor line 135 is constructed as a flattened rectangular body, which can reduce the part count as compared to a similar system wherein the condensate/vapor line is not built as a flattened rectangular body. The reduction in part count can result in lower manufacturing complexity, lower manufacturing cost, and higher manufacturing yield.

FIGS. 8 and 9A-9E illustrate a thermosiphon system 130 in which the evaporator 132 includes a chamber 146 and a plurality of evaporator fins 142. The housing can include a base 140 and a case 144 that is secured to the base 140. The case 144 can be provided by the tube of the condensate/ vapor line 136. An opening 145 can be formed in the bottom surface of the condensate/vapor line 136. The base 140 abuts the condensate/vapor line 136 and surrounds the opening 145. The opening 145 may be of the same shape as the base, e.g., square. The volume sealed above the base 140 inside the case 144 provides the chamber 146 for the condenser 132.

The top surface of the base 140 provides an evaporator pan 143. That is, the top surface 140 includes a portion i) that is recessed relative to the bottom of the central passage 138*b*, and ii) in which the liquid phase of the working fluid 160 collects. For example, the top surface of the evaporator pan can be recessed relative to the bottom of the central passage 138*b* by about 1 mm to 5 mm, e.g., 2 mm.

The evaporator fins 142 project upwardly from the evaporator plan 143 so that they are above the bottom of the central passage 138*b*. When the liquid phase of the working fluid overflows the evaporator pan 143, it floods the bottom section of the inner passage 138*b*. Thus, the bottom of the inner passage 138*b* can be considered a floodplain. In addition, this ensures that the evaporator fins 142 remain only partially submerged in the liquid phase of the working fluid.

The housing can be a flattened rectangular body, of the same outside dimensions as the outside dimensions of the condensate/vapor line 136. The housing can also comprise extensions of the outer passages 138*a* and the central passage 138*b* of the condensate/vapor line 136.

The base 140 can be formed of the same material as the housing, e.g., aluminum. Alternatively, the base 140 can be formed of a different thermally conductive material, e.g., copper. The housing, e.g., the bottom of the base 140, can directly contact the electronic device 124, e.g., the top surface of the electronic device 124. Alternatively, the housing, e.g., the bottom of the base 140, can be connected to the electronic device 124, e.g., the top surface of the electronic device 124, by a thermally conductive interface material 141, e.g., a thermally conductive pad or layer, e.g., a thermally conductive grease or adhesive.

The evaporator fins 142 contact the bottom interior surface of the housing, e.g., the top surface of the base 140. The evaporator fins project upwardly from the evaporator pan 143. Thus, the evaporator fins 142 provide a thermally conductive area that transfers heat from the base 140 to the working fluid 160. The tops of the fins 142 can project above the floor of the condensate/vapor line 136.

The fins can be arranged substantially in parallel. In some implementations, the fins extend generally parallel to the width of the central passage 136*b*, i.e., perpendicular to the length of the condensate/vapor line 136.

In addition, the evaporator fins 142 can be configured to draw the working fluid 160 away from the base 140 by capillary action. For example, the evaporator fins 142 can be stamped or otherwise imprinted with features, e.g., grooving, which tends to draw the working fluid upward.

In some implementations, the fins can have undulations along their length. The undulations can have a pitch between 1 mm and 2 mm and an amplitude between between 0.1 and 0.5 mm. As shown in FIG. 9E, these undulations can cause some of the liquid phase of the working fluid 160 to move up the fins 142 by capillary action. This can improve the efficiency of the evaporator 132 by exposing more of the surface area of the fins 142 to the liquid phase of the working fluid.

The fins can be constructed of the same material as the evaporator, e.g., aluminum. Alternatively, the fins can be constructed of a different thermally conductive material, e.g., copper.

Figure 9B:
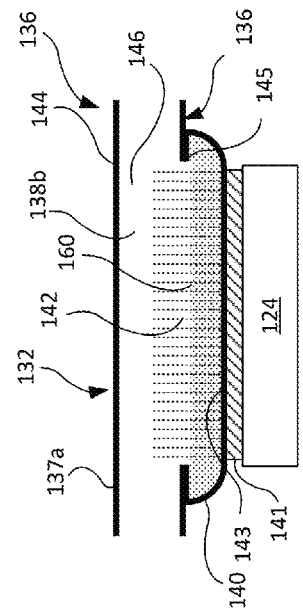
FIGS. 9A and 9B illustrate cross-sectional side views of an implementation of an evaporator from a thermosiphon system, which can be a view taken along lines 9A-9A and 9B-9B of FIG. 8, respectively.
Figure 9A:
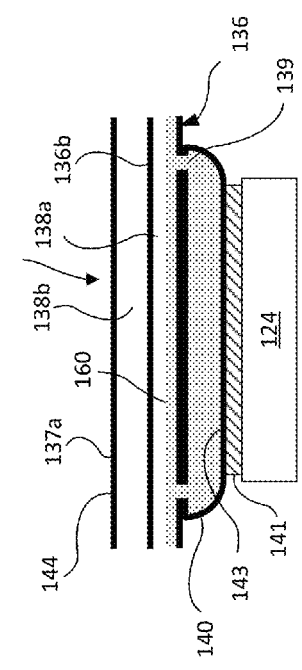

The chamber 146 can comprise extensions of the outer passages 138*a* and the central passage 138*b*. The top of the chamber 146 can be flush with the top of the central passage 138*b*. A plurality of apertures 139 are formed in the outer passages 138*a* in a region above the fins 142. Although FIGS. 9A and 9D illustrate two apertures 139, there could be more than two apertures.

In operation, the working fluid 160, in liquid form, flows from the outer passages 138*a* into the central passage 138*b* and the evaporator pan 143. The working fluid 160 can flow through the apertures 139 and onto the evaporator fins 142 (see FIGS. 9A, 9D and 9E). The working fluid can fill a volume between the base 140 and the bottom of the outer passages 138*a*, thereby forming a thin layer 162 of working fluid on the evaporator fins 142. In particular, the thin layer 162 can be formed in the valleys between the undulations of the fins. A remainder of the working fluid can flow down the outer passages 138*a* to another evaporator 132. By creating a thin layer 162 of the working fluid 160, the thermal resistance of the evaporator is effectively reduced (because the working fluid can evaporate more readily from a thin layer, permitting greater heat transfer).

Turning now to the condenser 132, the condenser 132 includes a plurality of chambers, and a plurality of heat conducting fins. The chambers can be parallel and vertically-extending. The top ends of the chambers can be closed off, i.e., there is no top header that interconnects the top ends of the chambers.

FIGS. 10-14 illustrate a first implementation of the condenser 134 that has a body 170 having cavity 174 formed therein, and a plurality of walls 172 in the cavity that divide the cavity 174 into a plurality of parallel vertically-extending chambers 174*a*. The chambers 174*a* can be parallel and vertically-extending. The top ends of the chambers 174*a* can be closed off, i.e., there is no top header that interconnects the top ends of the chambers 174*a*. The walls 172 act as a condensation surface and to conduct heat from the vapor, through the body to the fins.

The cavity 174 also includes a central channel 176 with an opening to the exterior of the body 170 which is coupled to the condensate line 136. The vertically-extending chambers 174*a* can extend laterally from the central channel 176, and the chambers 174*a* can extend parallel to the long axis of the body 170 (i.e., the body has a length greater than its width, and the long axis is along the length). The central channel 176 can extend laterally perpendicular to the long axis. When the condenser 134 is installed on the frame, the central channel 176 can run from the front toward the rear of the body 170. A first set of the vertically-extending chambers 174 can extend laterally from a first side of the central channel 176, and a second set of the plurality of vertically-extending chambers 174 can extend laterally from an opposite second side of the central channel 176. The body 170 can be a generally rectangular solid, although other shapes are possible.

This implementation of the condenser 134 that has a plurality of heat conducting fins 180 that project outwardly from the body 170. For example, the fins 180 can project vertically from the body 170. The fins 170 can be generally flat, narrow sheets. The fins 180 can project in parallel to each other from the body 170, and can be spaced apart with a regular pitch along a direction normal to their flat primary surfaces. In some implementations, the fins 180 include at least a first plurality of fins 180a that project upwardly from the top surface of the body 170. In some implementations, the fins 180 also include a second plurality of fins 180b that project downwardly from the bottom surface of the body 170.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis perpendicular to, or at a slight angle to, the long-axis of the chambers 174a and/or the body 170.

Returning to FIG. 2, the condenser 134 can rest on the frame 120, and the fins 180b that project downwardly from the bottom surface of the body 170 can project below the plane of the motherboard 122. This can improve the available surface area for the fins to improve the heat transfer rate of the condenser 134. This can also assist in limiting the vertical height of the condenser 134 so that the thermosiphon system 130 is compatible with the limited height available in the server rack environment. For example, a total height from a bottom of the tray to a top of the heat conducting fins can be at most 6 inches, e.g., at most 4 inches. Also, if the fans 162 are on the side of the condenser 130 farther from the evaporator 124, the fins can add to the surface area involved in forced convection.

Figure 10:
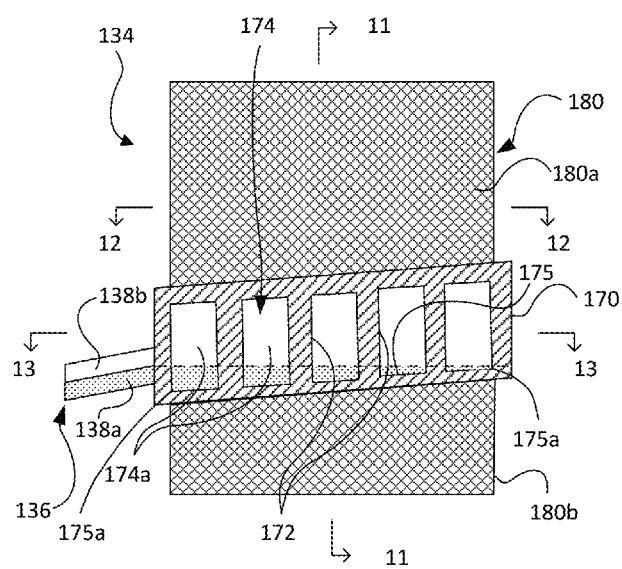
FIGS. 10 and 11 illustrate side views, cross-sectional, of a condenser from the thermosiphon system.
Figure 11:
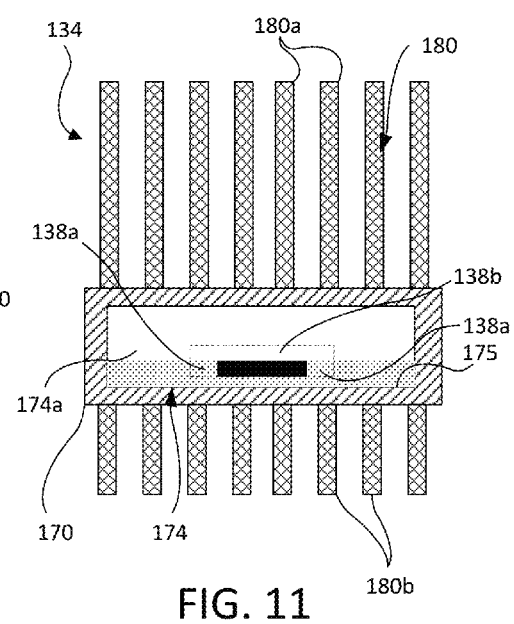
Figure 12:
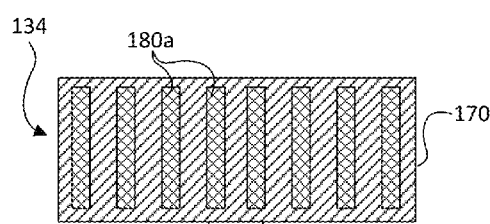
FIGS. 12 and 13 illustrate top views, cross-sectional, of the thermosiphon system of FIGS. 8 and 9.

As shown in the implementation of FIGS. 10 and 11, the outer passages 138a can connect to the cavity 174 of the condenser 134 at positions vertically lower than the central passage 138b. The bottom of the central passage 138b can be vertically level with the top of the outer passages 138a.

Referring to FIG. 10, the floor 175 of the cavity 174 can be sloped, with the side 175a abutting the condensate/vapor line 136 at a vertically lower position than the side 175b on the opposite side of the cavity 174 from the condensate/vapor line 136. The floor 175 of the cavity 174 can be sloped at an angle of 1°-30°, e.g., 7.5°, relative to horizontal. Since in operation the fins 180 typically project vertically, the floor 175 of the cavity 174 can be at angle of 60°-89° relative to fins 180. In some implementations, the floor 175 of the cavity 174 is sloped at the same angle as the portion 133 of the condensate/vapor line 136.

The fluid level and the vertical offset of the central passage 138b can be set such that the openings to the outer passages 138a are at least partially covered with liquid, and the opening to the central passage 138b is exposed only to vapor. The sloped floor 175 of the cavity 174 can cause the liquid phase of the working fluid to pool in the cavity 174 near the condensate/vapor line 136, which improves the likelihood that the entrances to the outer passages 138a remain covered by the liquid phase of the working fluid. Furthermore, the sloped floor 175 of the cavity 174 can increase the proportion of the vapor phase of the working fluid in the portion of the cavity 174 on the opposite end from the condensate/vapor line 136, thus keeping more of the fins 180 in that region exposed to the vapor phase of the working fluid.

Figure 15:
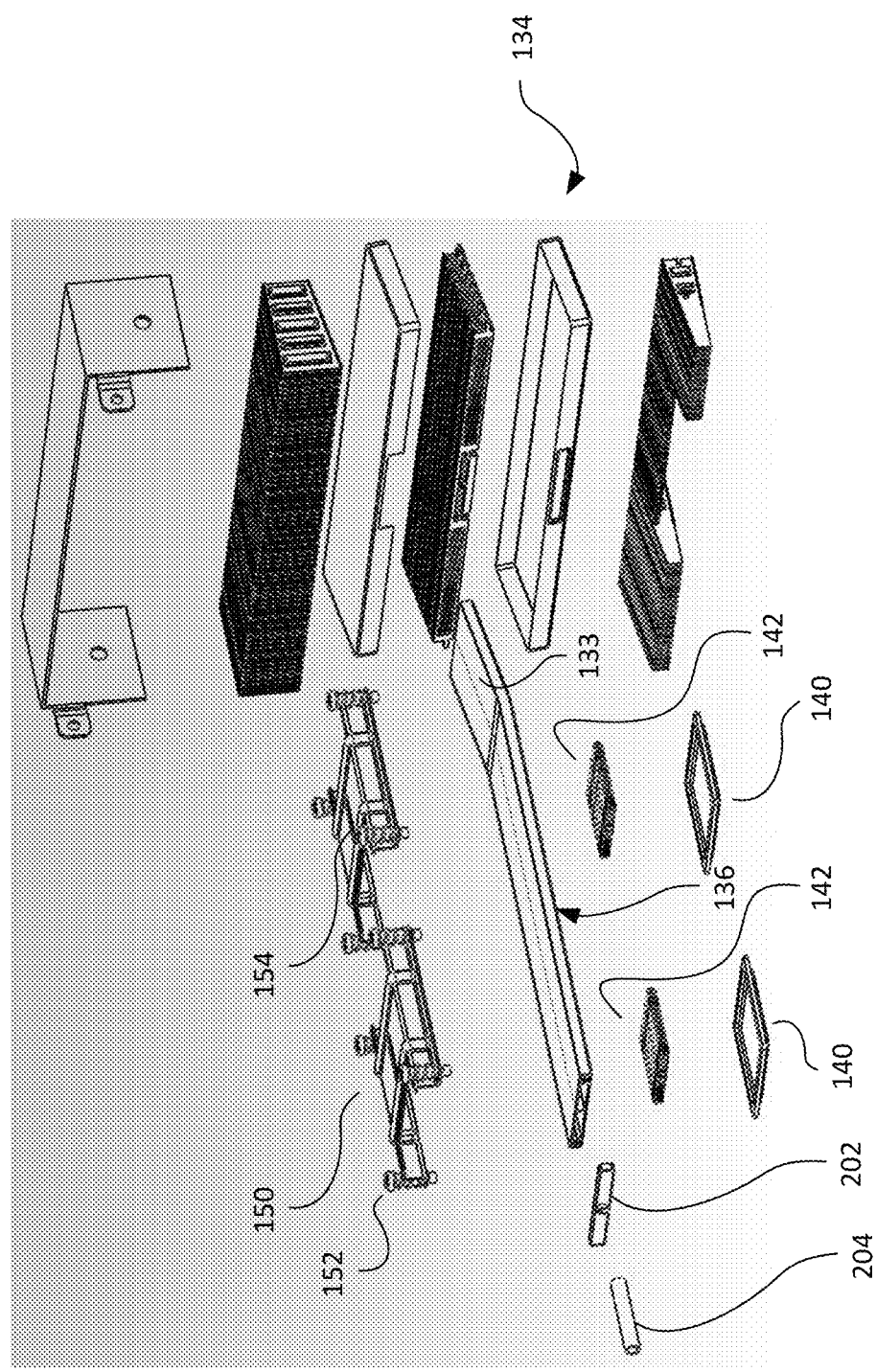
FIG. 15 illustrates an exploded perspective view of a thermosiphon system.

Referring to FIG. 15, the evaporator 132, the condenser 134, and the condensate/vapor line 136 can be constructed of the same material, e.g., aluminum. Constructing the evaporator 132, the condenser 134, and the condensate/vapor line 136 using the same material can reduce manufacturing complexity. For example, the evaporator 132, the condenser 134, and the condensate/vapor line 136 can be formed in a single brazing process, wherein all three parts are simultaneously heated to a temperature sufficient to braze the parts together. For example, for aluminum, all the parts can be heated to a temperature between about 580-620° C. This provides a unitary part that is less likely to develop leaks. In addition, reducing the number of brazing steps can reduce manufacturing cost.

Alternatively, a portion of the evaporator 132, e.g., a bottom floor of the evaporator which contacts the heat-generating electronic device 124, may be constructed of a different material, e.g., copper. This configuration can also reduce manufacturing complexity to some degree, as the condenser 134 and the condensate/vapor line 136 can still be formed together in a single brazing process.

Figure 16:
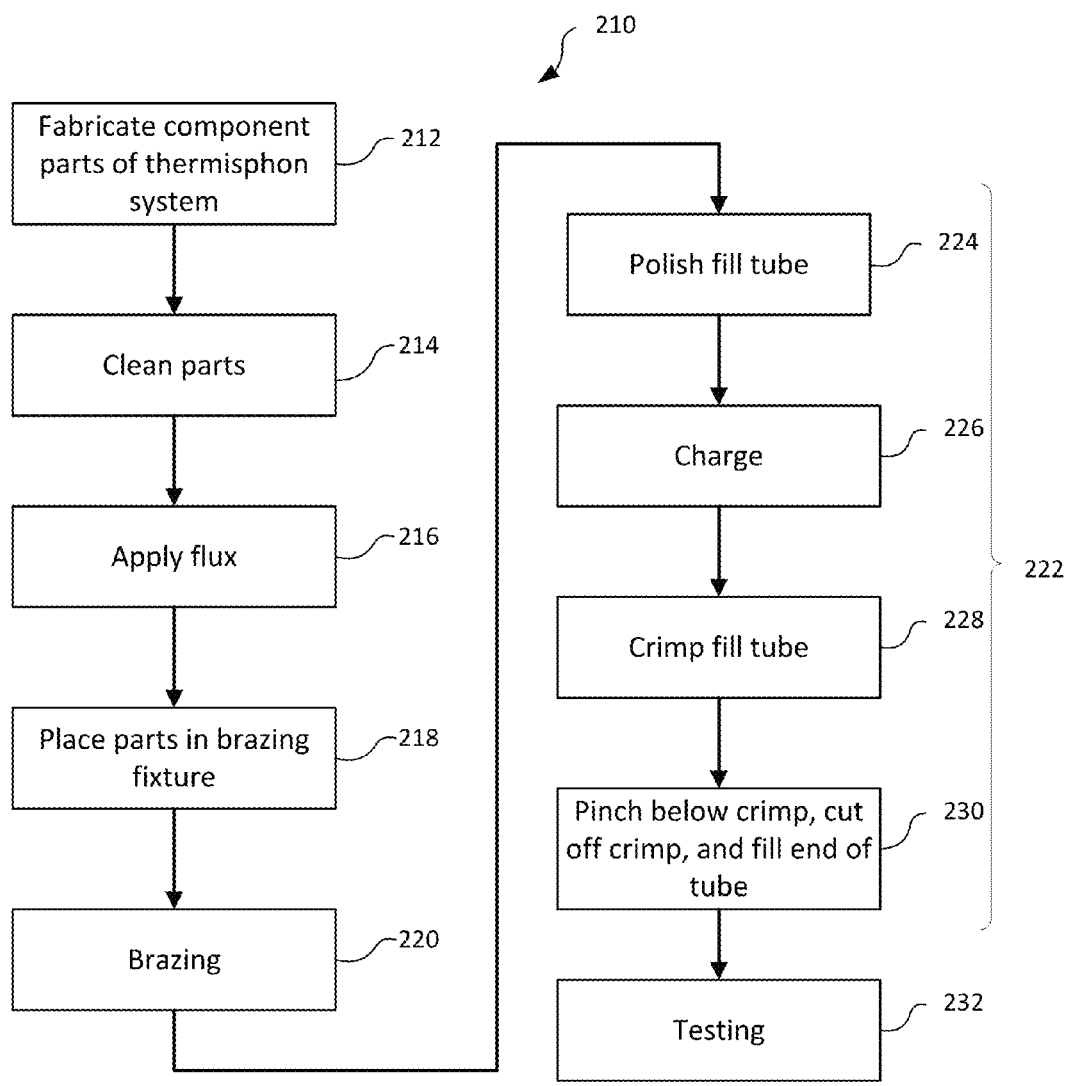
FIG. 16 is a flow chart of a method of assembling a thermosiphon system.

FIG. 16 is a flow chart illustrating an example of a process 210 that can be used to construct a thermosiphon system, e.g., the system illustrated in FIGS. 6-15. Initially, the component parts of the thermosiphon system are fabricated (212). For example, the components to provide evaporator and condensate line assembly can include the main body 136 of the condensate line, an end cap 202 to fit into the open end of the main body of the condensate line, a fill tube 204 to fit into an aperture in the end cap 212, the base 140, and the evaporator fins 142. During assembly, the evaporator fins 142 will sit on the base 140, and the base will abut the bottom of the condensate line 136 with the fins 142 fitting into the opening 146 in the bottom surface of the condensate line 136. Each individual part can be fabricated as extruded aluminum. In some implementations, each part illustrated in FIG. 15 is manufactured as an individual component.

The components are cleaned (214) to remove oils or other contaminants, and a flux is applied to regions of the components that will be joined (216). Examples of flux include BAlSi based paste, optionally including salts of potassium chloride and/or sodium chloride. In some implementations, the components are stamped and formed from an aluminum sheet that has a pre-applied flux.

Figure 17:
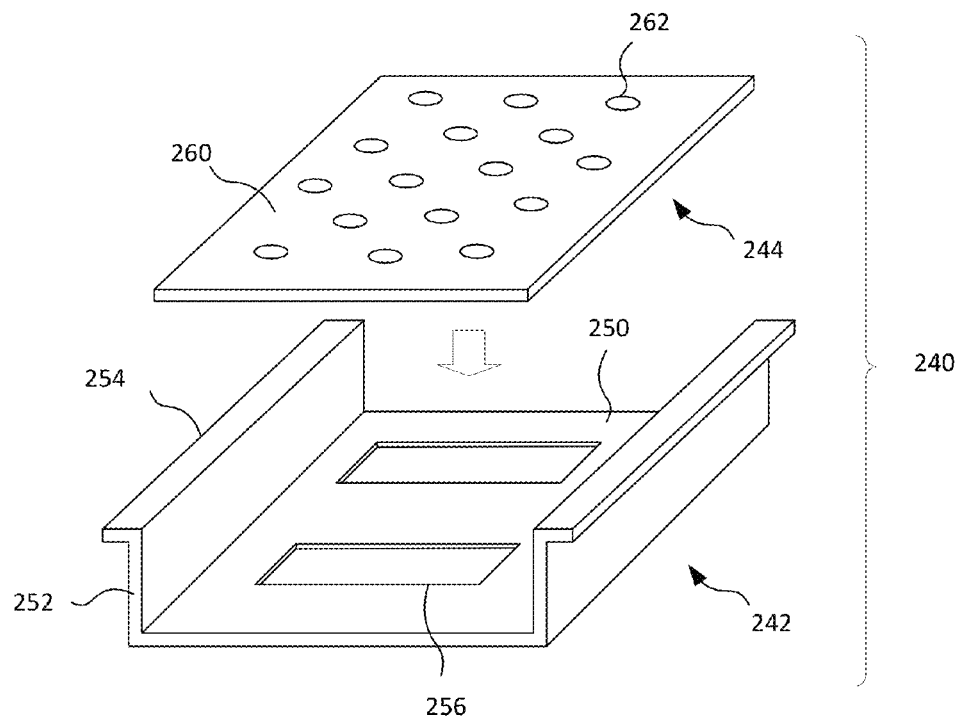
FIG. 17 illustrates a brazing fixture.

The components are assembled and held by a brazing fixture (218). An example of a brazing fixture 240 is illustrated in FIG. 17. The fixture 240 can include a bottom portion 242 and a top portion 244; during brazing the components of the condensate line and evaporator(s) will be sandwiched between the bottom portion 242 and the top portion 244. The brazing fixture 240 can be formed of stainless steel or black iron steel.

In some implementations, at least the bottom portion 242 includes reinforcing members to prevent flexing of the bottom portion 242 during the brazing process. For example, the bottom portion 242 can include a flat bottom panel 250 and vertical side walls 252 that extend upwardly from the opposing edges of the bottom panel 250. Optionally, horizontal rims 254 can extend outwardly from the top edges of the side walls 252. The spacing between the side walls 252 can be such that the main body of the condensate line 136 fits snuggly between the side walls 252. One or more recesses 256 can be formed in the bottom panel 250 to provide precise positioning of the base 240 for each evaporator. The recesses 256 or other surfaces that provide precision datums for the assembly, e.g., for the bottom surfaces of the evaporators, can be precision machined so that these surfaces are effectively coplanar.

The top portion 244 can include a flat top panel 260. A plurality of apertures 262 can be formed through the top panel 260 to reduce the mass of the fixture so that it takes less time to cool.

Figure 18:
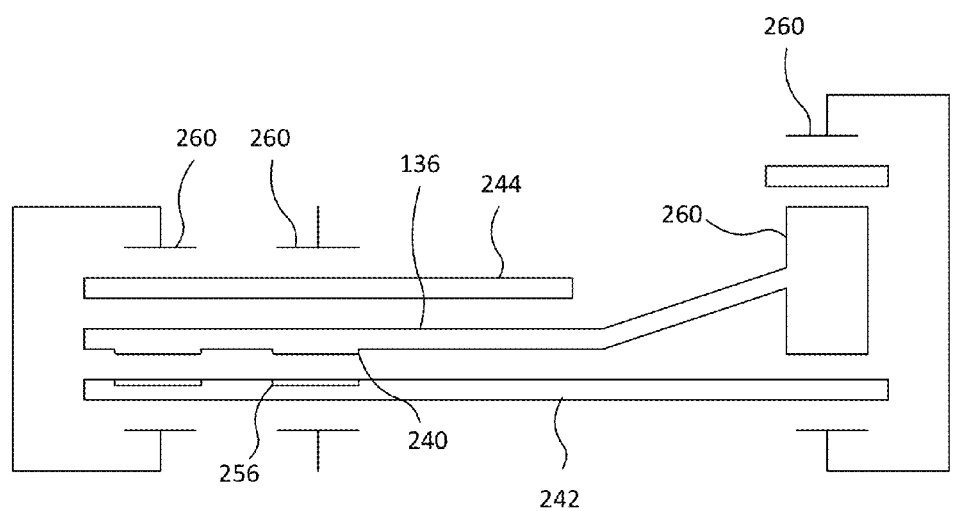
FIG. 18 is an exploded cross-sectional illustration of components of the thermosiphon system clamped in the brazing fixture.

FIG. 18 shows the assembly of components held between the bottom portion 242 and the top portion 246 of the brazing fixture 240. In particular, the bottom surfaces of the evaporators are placed against the precision machined surfaces of the bottom portion of the 242. For example, the bases 240 can fit into recesses 256. Then one or more clamps 260 are used to clamp the assembly of components between the t bottom portion 242.

Figure 19A:
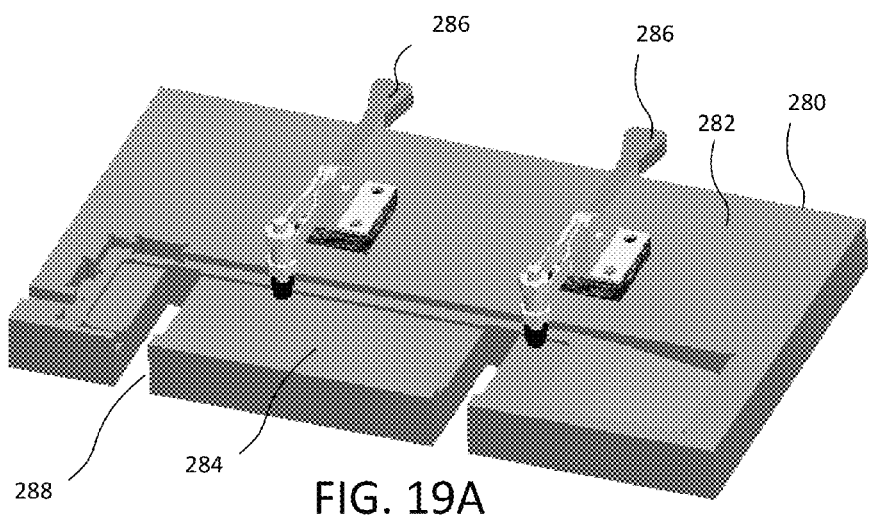
FIGS. 19A-19H illustrate a process of assembling components of the thermosiphon system clamped in the brazing fixture.

In some implementations, the components of the thermosiphon and the brazing fixture are assembled on an assembly jig. FIG. 19A illustrates an example of an assembly jig 280 for assembly of the components of the evaporator. The assembly jig 280 is a generally rigid body and can be formed of a rigid plastic such as olyoxybenzylmethylenglycolanhydride, e.g., Bakelite™. A top surface 282 of the assembly jig 280 includes a recess 284 into which the components of the thermosiphon (e.g., the evaporator in this implementation) will fit. The assembly jig 280 can also include soft clamps 286 to press the components into the recess 284.

Figure 19B:
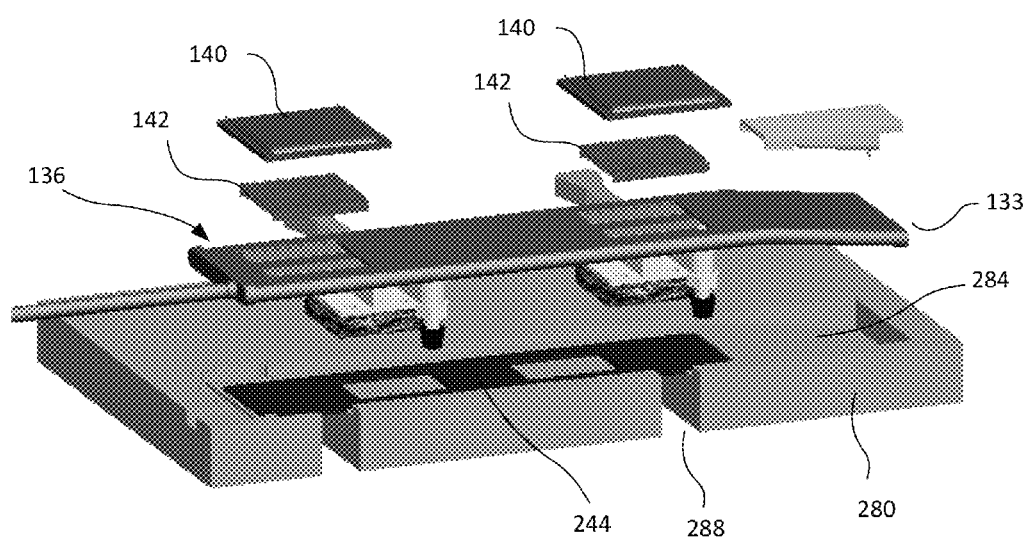
Figure 19C:
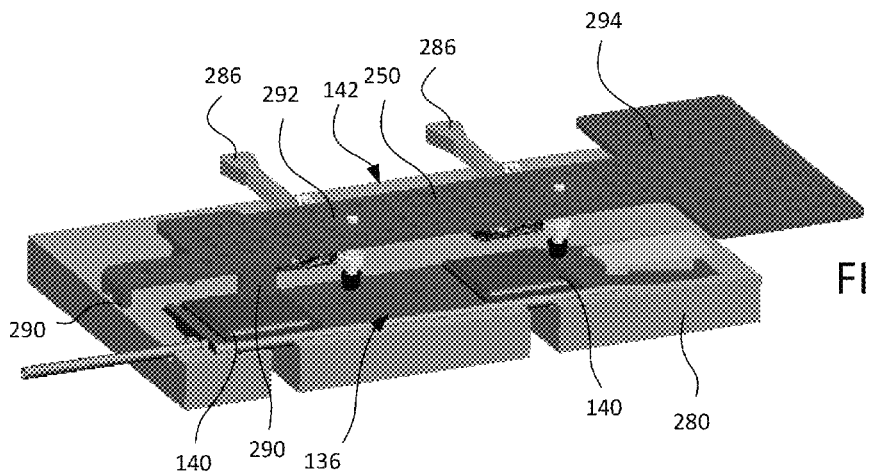

As shown in FIG. 19B, to assemble the thermosiphon, the top portion 244 of the brazing fixture can be placed first onto the assembly jig 280, followed by the vapor/condensate line 136, the evaporator fins 142 and the base 140 of the evaporator. in some implementations the thermosiphon is assembled Then, as shown in FIG. 19C, the bottom portion 242 of the brazing fixture 240 is placed on the assembly jig 280 over the other components. Although FIGS. 19B-19C show the thermosiphon being assembled "upside-down," in some implementations the thermosiphon could be assembled "right-side-up."

The bottom portion 242 of the brazing fixture shown in FIG. 19C lacks the reinforcing side walls shown in FIG. 17. Also, the bottom portion 242 need not include a recess to receive the base 140 of the evaporator, but can simply have a flat surface 242. In addition, the bottom portion can include a narrow section 292 to hold the evaporator tube and a wide section 294 to hold the condenser. Furthermore, the bottom portion can include tabs 290 to constrain the tube-side end of the evaporator. The tabs 290 can project perpendicular to the flat bottom panel 250 of the bottom portion 242, and can have chamfered ends. When the bottom portion 242 of the brazing fixture is lowered onto the assembly jig 280, some of the tabs 290 can fit into deeper sections of the recess 284.

Figure 19D:
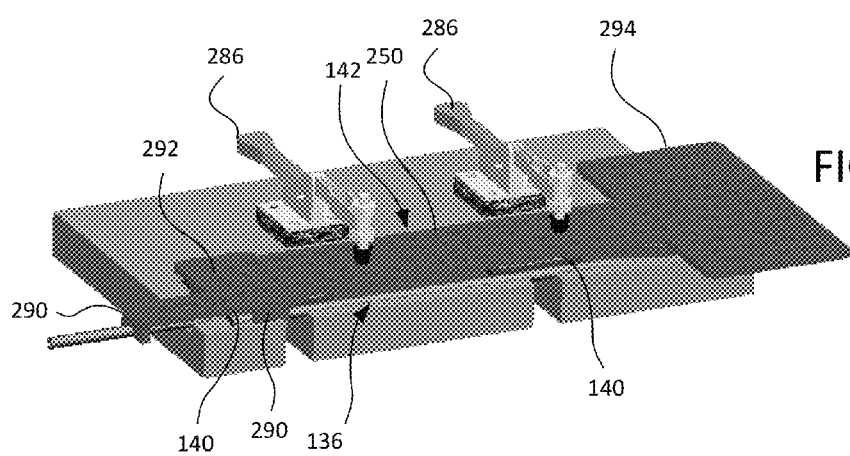
Figure 19E:
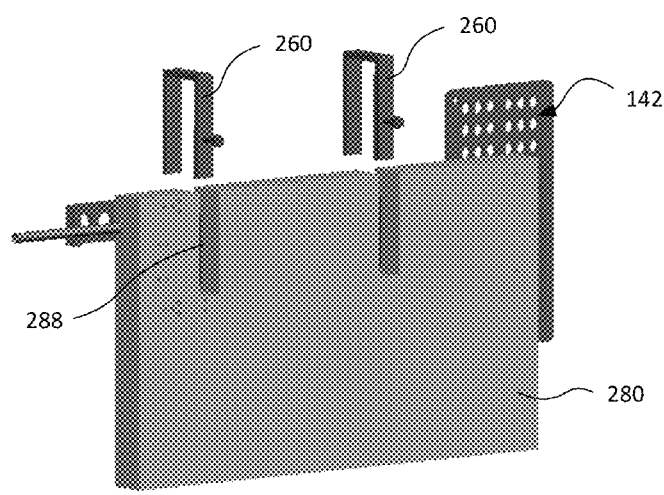
Figure 19F:
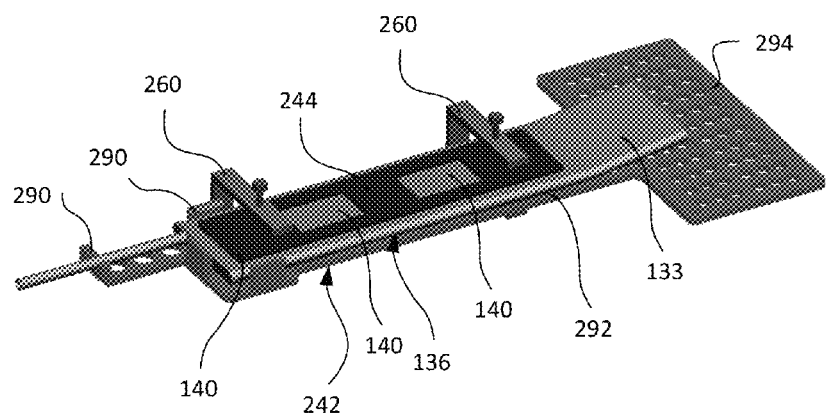

Once the components are on the assembly jig 280, the soft clamps 286 are used to press the components and brazing fixture in place, as shown in FIG. 19D. As shown in FIG. 19E, while the components and brazing fixture are held by the soft clamps 286 on the assembly jig 280, the clamps 260 that will be used during the brazing process can be fitted around the components and brazing fixture and tightened. At least one tong of the clamp 260 can fit into a slot 288 that extends from the sides of the assembly jig 280 to provide access to lower side of the assembly of components and brazing fixture. The soft clamps 286 can then be released, and as shown in FIG. 19F, the assembly with evaporator components, brazing fixture and clamps then removed from the assembly jig.

Figure 19G:
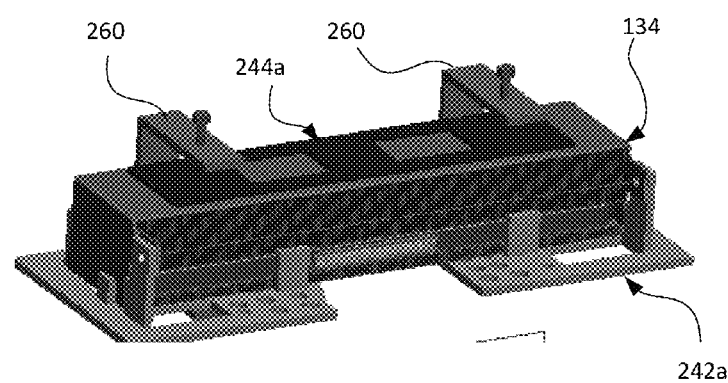

The components of the condenser can similarly be initially assembled on a separate portion of the brazing fixture. For example, as shown in FIG. 19G, there can be a separate lower portion 242a and upper portion 244a of the brazing fixture for the components of the condenser 134.

Figure 19H:
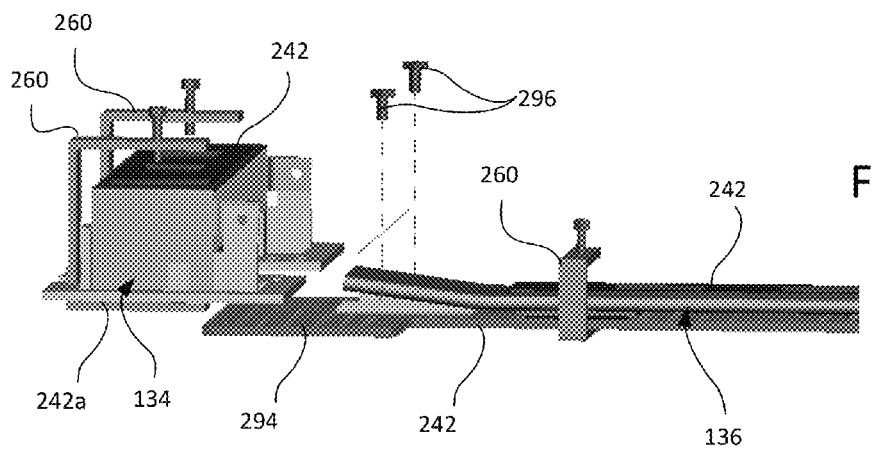

Referring to FIG. 19H, prior to brazing, the vapor/condensate line 136 is placed to abut the components of the condenser 134, and the bottom portions 242, 242a of the brazing fixture are joined. For example, the sub-assembly of the condenser components and fixture can be placed with the bottom portion 242a of the fixture for the condenser seated on the wide section 292 of the lower portion 242 of the fixture for the evaporator. The condenser sub-assembly can then be slid horizontally relative to the evaporator sub-assembly until the vapor/condensate line 136 is in the proper location contacting the components of the condenser 134. The bottom portions 242, 242a can then be mechanically fastened, e.g., by bolts 296 that fit through aligned holes in the bottom portions 242, 242a and are secured by nuts.

Returning to FIG. 16, the assembly of components is then brazed (220). For example, the components, held by the fixture, are placed in a furnace and heated so that the components are brazed to form a single joined body. The furnace can be heated to a temperature around 600° C. The brazing operation can be performed for about 60 to 90 minutes; the components should be stabilized at the brazing temperature for about 15 to 30 minutes. Since the evaporator components are firmly clamped in the fixture 240, the bottom surfaces of the evaporators are forced against the precision surfaces. Moreover, due to the rigidity of the brazing fixture 240, e.g., as provided by the vertical walls 252, the bottom portion 242 undergoes very little flexing. As a result, the bottom surfaces of the evaporators can be held in a very tight alignment, e.g., effectively coplanar, e.g., within +/−0.05 mm. This tight alignment can provide superior thermal contact between the evaporator and the computer components when the thermosiphon is installed, resulting in improved thermal efficiency.

Next, the thermosiphon system is charged with the working fluid and the fill tube is sealed (222). Charging the thermosiphon system can be a multi-step process, as described below.

In some implementations, to charge the thermosiphon system, the fill tube 204 (see FIGS. 5 and 15) is polished (224) to remove any oxide build-up. In particular, both the inside surface and outside surface can be polished. This can improve metallurgical bonding of the fill tube during the crimping process.

Optionally, before or after polishing, the remainder of the thermosiphon system (other than the fill tube which is still open), can be tested for leakage (226). For example, the thermoiphon system can be filled with an inert gas, e.g., Helium, through the fill tube to the maximum expected operating pressure, e.g., 5 atmospheres. A chamber surrounding the thermosiphon can be pumped to a vacuum of a 100 militorr, and a helium leak detector with the ability to measure a leak down to $10^{-9}$ atm*cc/sec can be connected to the chamber. Detection of helium can indicate that the thermosiphon has a leak. The helium can be released from the thermosiphon when the leakage test is completed.

The thermosiphon is then charged with the working fluid (226). In particular, the entire interior of the thermosiphon system 130, including the interior of the evaporator 132, condenser 134 and vapor/condensate line 136, can be vacuum filled and sealed. Initial vacuum can be pulled to achieve an internal absolute pressure below 0.05 millibar (5 Pa) to remove air from the thermosiphon system 130, and then the working fluid can be introduced into thermosiphon system 130.

The working fluid can be a dielectric, non-flammable fluid with low toxicity, although but hydrocarbons such as methanol, ethanol or acetone can also be suitable. The composition of the working fluid and internal pressure of the thermosiphon system can be selected to provide a boiling point of the working fluid in the evaporator at about the desired operating temperature for the electronic devices, e.g., around 30-100° C., e.g., 45-55° C. Examples of the working fluid include Vextral XF sold by DuPont, Flourinert Electronic Liquid FC-72, sold by 3M, Novec 7100, sold by 3M, and HFC245fa sold by Honeywell.

Following the charging, the fill tube is sealed, e.g., by crimping the fill tube (228).

Although crimping the fill tube can cause the interior surfaces of the fill tube to contact and create a metallurgical bond, in some situations it is advantageous to provide an even stronger seal. In some implementations, immediately after charging, the end of the fill tube 204 is crimped (228), providing a crimped section 270 (see FIG. 20A). This crimping is sufficient to provide a temporary seal, e.g., sufficient to last while the thermosiphon system is transported to a separate station to provide a permanent seal. Next, a portion of the fill tube 204 between the crimped section 270 and the condensate line 236 is pinched (230). This forms a pinched section 272 (see FIG. 20B). The same mechanical techniques can be used for both crimping and pinching, e.g., the same amount of force can be used. The crimped portion of the fill tube is cut off (230), leaving just the pinched section 272 (see FIG. 20C). The open end of the fill tube can then be filled or capped (230) with a filler material 274 (see FIG. 20D). For example, the filler material can be a brazing material, and heat can be applied to just the end of the fill tube 206, e.g., with an acetylene torch, to braze the material 274. By filling and brazing the end of the fill tube 206, leakage of working fluid can be significantly reduced and lifetime of the thermosiphon system can be improved.

The filled thermosiphon system can then be subjected to quality testing (232), e.g., thermal testing to check that the system provides the required thermal efficiency.

Returning to FIGS. 11, 14 and 15, when the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis parallel to the long-axis of the chambers 174a.

In either implementation of the condenser, both the body 170 of the condenser 134 and the fins 180 can be formed of a material with a good terminal conductivity, comparable or better than aluminum, e.g., of at least 200 W/mK. A nickel plating can be used to solder the fins 180 to the body 170, or the fins 180 can be brazed to the body 170.

Figure 21:
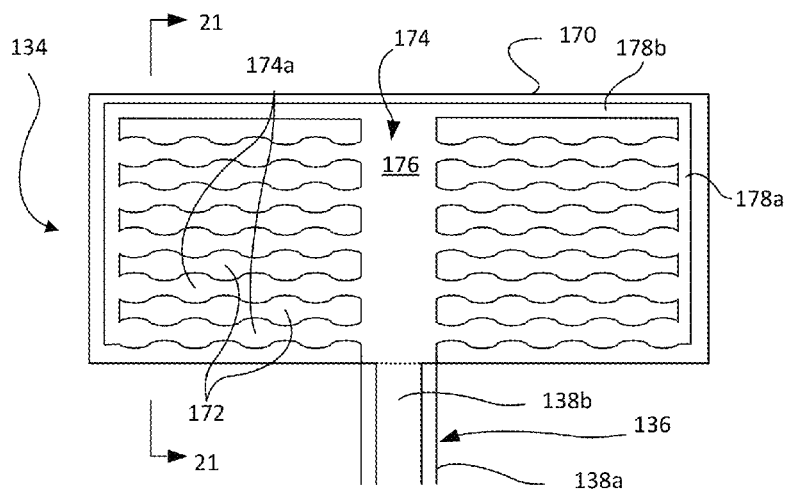
FIG. 21 illustrates a top view, cross-sectional, of another implementation of a condenser.
Figure 22:
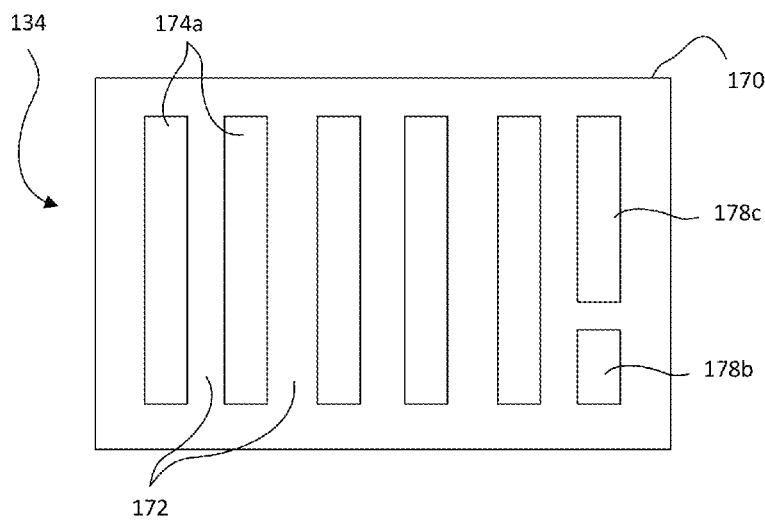
FIG. 22 illustrates a side view, cross-sectional, of the implementation of the condenser in FIG. 21.

Referring to FIGS. 21-22, in another implementation of the condenser, the ends of the chambers 174a further from the central channel 176 can be connected by a channel 178a. The channel 178a is fluidically connected by a channel 178b to an end of the central channel 176 further from the outer tube 138a. The channels 178a and 178b can be shorter than the chambers 174a, e.g., the channel 178a can be connected to the bottom of chambers 174a. Optionally, an additional laterally-extending chamber 178c can be positioned over the channel 178b to provide additional surface area for condensing. The condenser can otherwise be constructed similarly to the implementation shown in FIGS. 10-14. A potential advantage of this configuration is that at high flow capacity, fluid that would otherwise build up at the end of the chamber 174a farther from the central channel 176 and be unable to flow back due to vapor flow, can instead flow through the channels 178a and 178b and thus return to the outgoing outer passages 138a.

Figure 13:
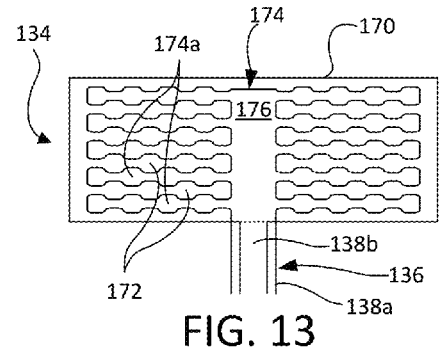
Figure 14:
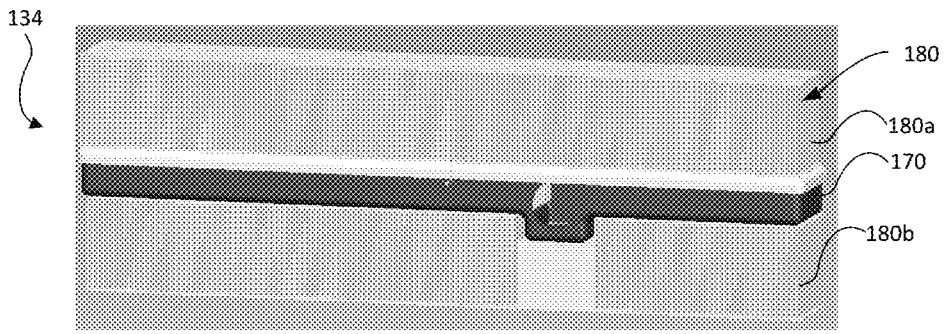
FIG. 14 illustrates a perspective view, cut away, of a condenser from the thermosiphon system.
Figure 23:
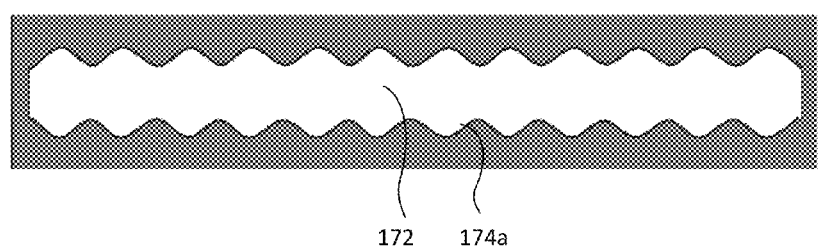
FIG. 23 is an expanded top view, cross-sectional, of a chamber in the condenser.

Referring to FIGS. 13 and 23, at least some interior surfaces of the condenser, e.g., surfaces that bound the cavity 174, can optionally be texturized. The texturization can apply to either implementation of the condenser. The cavity 174 provides an interior volume bounded by a substantially vertical interior surface, e.g., a surface of one of the walls 172. The texturization of the interior surface can include undulations projecting inwardly into the interior volume. The undulations can be uniform along a vertical first axis, and can project into the interior volume along a second axis perpendicular to the vertical first axis. Peaks of the undulations can be spaced apart, e.g., with a regular pitch, along a third axis perpendicular to the first axis and the second axis. The third axis can be parallel to the long axis of the body 170 and/or the chamber 174a. Each chamber 174a can have a length along the third axis and a width along the second axis with the length being greater than the width. The undulations can be smooth, e.g., no discontinuities in the surface along the second axis.

The undulations can have a pitch along the third axis between 0.1 and 1 mm and can have an amplitude along the second axis between 0.1 and 1 mm. In some implementations, a ratio of the pitch to the amplitude is between about 1:1 to 2:1. In some implementations, the undulations can form a sinusoidal wave. In some implementations, the undulations are formed by a plurality of curved segments in which dK/dS is equal to a constant value, where K is an inverse of the radius of curvature of the undulation and S is a distance along a curved segment. Other shapes for the undulations are possible. These undulations can cause thinning of the film of condensed working fluid that forms on the vertical interior surface, thereby reducing the thermal resistance of the condenser.

Although a server rack sub-assembly has been described above, the thermosiphon system could be used with heat-generating electronic devices mounted on a motherboard that is not part of a server rack sub-assembly, e.g., on a motherboard in a desktop computer, or could be used with heat-generating electronic devices that are not mounted on a motherboard. In some implementations, the evaporator fins could be replaced by a porous wicking material.

A number of embodiments of the invention have been described. Nevertheless, it will be understood that various modifications may be made without departing from the spirit and scope of the invention. Accordingly, other embodiments are within the scope of the following claims.

What is claimed is:

1. A method of assembling a thermosiphon system, comprising:
    charging the thermosiphon system with a working fluid through a fill tube;
    crimping the fill tube to form a crimp;
    pinching the fill tube at a position to provide a pinch further from an end of the fill tube than the crimp;
    removing a portion of the fill tube including the crimp but not the pinch;
    sealing the fill tube, wherein sealing the fill tube comprises filling a portion of the fill tube beyond the pinch with a filler material.

2. The method of claim 1, wherein the filler material comprising a brazing material and brazing the portion of the fill tube beyond the pinch.

3. The method of claim 2, comprising applying heat selectively to the portion of the fill tube beyond the pinch to braze the brazing material.

4. The method of claim 3, wherein applying heat selectively comprising heating the fill tube with a torch.

5. The method of claim 1, comprising polishing the fill tube prior to charging the thermosiphon system.

6. The method of claim 5, wherein polishing polishes an interior surface of the tube.

7. The method of claim 5, wherein polishing polishes an exterior surface of the tube.

* * * * *